United States Patent [19]
Stevens et al.

[11] Patent Number: 5,298,448
[45] Date of Patent: Mar. 29, 1994

[54] METHOD OF MAKING TWO-PHASE BURIED CHANNEL PLANAR GATE CCD

[75] Inventors: Eric G. Stevens; Stephen L. Kosman, both of Rochester, N.Y.

[73] Assignee: Eastman Kodak Company, Rochester, N.Y.

[21] Appl. No.: 995,393

[22] Filed: Dec. 18, 1992

[51] Int. Cl.⁵ .......................................... H01L 21/339
[52] U.S. Cl. ..................... 437/53; 437/187; 437/962
[58] Field of Search ............... 437/50, 53, 187, 978, 437/962; 148/DIG. 106

[56] References Cited

U.S. PATENT DOCUMENTS

| | | | |
|---|---|---|---|
| 3,852,799 | 12/1974 | Walden | 257/248 |
| 3,853,634 | 12/1974 | Amelio et al. | 437/53 |
| 3,911,560 | 10/1975 | Amelio et al. | 437/53 |
| 3,927,468 | 12/1975 | Anthony et al. | 437/53 |
| 3,931,674 | 1/1976 | Amelio | 437/53 |
| 4,027,381 | 6/1977 | Tasch, Jr. et al. | 437/187 |
| 4,027,382 | 6/1977 | Tasch, Jr. et al. | 437/187 |
| 4,035,906 | 7/1977 | Tasch et al. | 437/187 |
| 4,063,992 | 12/1977 | Hosack | 437/978 |
| 4,167,017 | 9/1979 | Tasch, Jr. et al. | 257/248 |
| 4,173,064 | 11/1979 | Farnow | 437/53 |
| 4,291,239 | 9/1981 | Weimer | 257/230 |
| 4,319,261 | 3/1982 | Kub | 257/249 |
| 4,402,761 | 9/1983 | Feist | 437/44 |
| 4,613,402 | 9/1986 | Losee et al. | 437/53 |
| 4,746,622 | 5/1988 | Hawkins et al. | 437/53 |
| 4,992,392 | 2/1991 | Nichols et al. | 437/53 |
| 5,114,872 | 5/1992 | Roselle et al. | 437/50 |
| 5,240,873 | 8/1993 | Shinji | 437/53 |

OTHER PUBLICATIONS

V. J. Kapoor, "Charge-Coupled Devices with Submicron Gaps", *IEEE Electron Device Letters,* vol. EDL-2, No. 4, pp. 92-94, Apr. 1981.

*Primary Examiner*—Brian E. Hearn
*Assistant Examiner*—C. Chaudhari
*Attorney, Agent, or Firm*—Raymond L. Owens

[57] ABSTRACT

The present invention is directed to a method of making a true two-phase CCD using a single layer (level) of the conductive material for the gate electrodes to provide a planar structure. The method includes using L-shaped masking layers having a submicron length of a bottom portion between two masking layers of silicon dioxide on and spaced along a surface of a conductive layer. The conductive layer is over and insulated from a surface of a body of a semiconductor material having a channel region therein. The L-shaped masking layers are removed to expose a spaced narrow portions of the conductive layer. The conductive layer is then etched completely therethrough at each exposed portion to divide the conductive layer into gate electrodes which are spaced apart by submicron width gaps.

20 Claims, 3 Drawing Sheets

METHOD OF MAKING TWO-PHASE BURIED CHANNEL PLANAR GATE CCD

FIELD OF THE INVENTION

The present invention relates to a method of making a planar gate charge-coupled device (CCD) having a single level gate electrode, and, more particularly, to a method of making a two-phase CCD having a planar gate electrode.

BACKGROUND OF THE INVENTION

In general a CCD comprises a body of a semiconductor material, such as single crystalline silicon, having a channel region in and along a surface of the body. A layer of an insulating material, typically silicon dioxide, is on the surface of the body and over the channel region. A plurality of conductive gate electrodes, typically of doped polycrystalline silicon, are on the insulating layer and extend across the channel region. The gate electrodes are positioned along the entire length of the channel region.

In a two-phase CCD, the gate electrodes are arranged in two sets which alternate along the channel region. The gate electrodes of one set are connected to a first phase potential, and the gate electrodes of the other set are connected to a second phase potential. Such a two-phase CCD also typically includes in the body a barrier region under an edge of each of the gate electrodes and extending across the channel region. The barrier regions prevent the charge from moving backwards along the channel region.

The two sets of gate electrodes could be formed from a single layer of the conductive material by depositing the single layer and defining it by photolithography and etching to form the spaced gates electrodes along the channel region. However, using commercial type photolithographic and etching techniques and equipment, it is difficult to form the gate electrodes having very narrow submicron gaps therebetween with the gaps being uniform across the entire width of the gate electrodes. Since relatively wide and/or non-uniform gaps can form potential barriers and/or wells between the gate electrodes, they can interfere with the transfer of charge from one gate electrode to the next. Therefore, it has been the practice to form the gate electrodes from two separate levels (layers) of the conductive material.

For a two level system, a first layer of the conductive material is deposited and defined to form one set of the gate electrodes, the first set of gate electrodes are covered with a layer of an insulating material, typically silicon dioxide. A second layer of the conductive material is then deposited over the first set of gate electrodes and the gaps between the first set of gate electrodes. The second layer of the conductive material is then defined to form the second set of gate electrodes which are between the gate electrodes of the first set. Also, each of the gate electrodes of the second set overlaps the adjacent gate electrodes of the first set. Since the gate electrodes overlap each other, there are no gaps therebetween which can form undesirable potential barriers and/or wells. However, the two level gate electrode system is non-planar since portions of the second set of electrodes extend over the first set of electrodes. Also, there is provided undesirable capacitance between the two sets of gate electrodes where they overlap.

Heretofore, submicron-gap, planar gate CCD structures have been reported, but they have been primarily three or four-phase devices. A two-phase submicron gap CCD is described in an article by V. J. Kapoor, published in *IEEE Electron Device Letters*, Vol EDL-2, No. 4, page 92, April 1981. However, the structure described in this article suffers from formation of potential wells and/or barriers between the barrier and storage regions within each phase resulting in low transfer efficiency. This is because this device is not a true two-phase structure, but has separate electrodes for the individual barrier and storage regions within each phase. Therefore, it would be desirable to have a method of making a true two-phase CCD having a single level of the gate electrodes so as to be planar, and having submicron gaps between the gate electrodes.

SUMMARY OF THE INVENTION

The present invention is directed to a method of making a CCD having a single layer (level) of gate electrodes which comprises forming a layer of a conductive material over and insulated from a surface of a body of a semiconductor material having a channel region therein. Masking layers having submicron lengths of the bottom portion are formed spaced along the conductive layer with each masking layer being between two additional masking layers of silicon dioxide. The submicron length masking layers are removed to expose narrow portions of the conductive layer. The conductive layer is etched therethrough at each of the exposed portions to divide the conductive layer into gate electrodes spaced apart by submicron width gaps.

Viewed from another aspect, the present invention is directed to a method of making a planar CCD which comprises the steps of forming a layer of a conductive material on a surface of a body of a semiconductor material of one conductivity type. Sections of a first masking layer are formed on the conductive layer with the sections being spaced apart along the conductive layer. A second masking layer is formed at one end of each of the first masking layer sections with the second masking layers all being at the same end of their respective first masking layer section. Each of the second masking layers has a portion extending across the space between its respective first masking layer section and the adjacent first masking layer section. A third masking layer is formed on the surface of the conductive layer in the space between the second masking layer and the adjacent first masking layer section. The second masking layers are removed to expose a narrow portion of the conductive layer between each first masking layer section and the adjacent third masking layer. The exposed portions of the conductive layer are then removed to divide the conductive layer into gate electrodes having gaps therebetween.

The invention will be better understood from the following more detailed description and claims taken with the accompanying drawings.

The drawings are not necessarily to scale.

DETAILED DESCRIPTION

Figure 1:
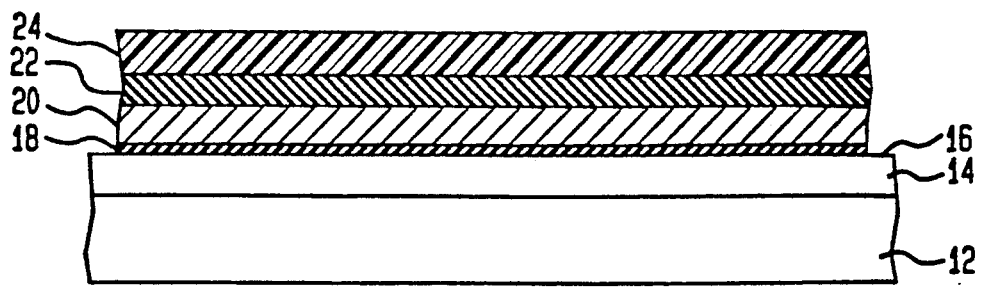
FIGS. 1-12 show sectional views of a CCD in various stages of fabrication in accordance with a method of the present invention.

Referring now to FIG. 1, there is shown a sectional view of a two-phase charge coupled device (CCD) 10 in an initial stage of fabrication in accordance with a method of the present invention. CCD 10 comprises a substrate body 12 of a semiconductor material of one conductivity type, such as p-type conductivity single crystalline silicon. The body 12 is provided with a region 14 therein of the opposite conductivity type, such as n-type conductivity, which extends to and along a surface 16 of the body 12. The region 14 forms the buried channel of the CCD 10. The region 14 may be formed by ion implanting an n-type conductivity dopant into the body 12 through the surface 16. On the surface 16 of the body 12 is a layer 18 of an insulating material, typically silicon dioxide. On the insulating material layer 18 is a layer 20 of a conductive material. Although the CCD 10 will be described with the conductive layer 20 being of deposited silicon, it can be of various other conductive materials, such as an optically transparent conductor, a metal, a metal alloy or a metal silicide. If an optically transparent conductor, a metal, metal alloy or a metal silicide is used for the conductive layer 20, it is covered with a layer of polycrystalline or amorphous silicon to permit the carrying out of the method of the present invention. On the conductive layer 20 is a first masking layer 22. The first masking layer 22 is of silicon dioxide deposited by a low temperature deposition technique. On the first masking layer 22 is a second masking layer 24 of a photoresist.

Figure 2:
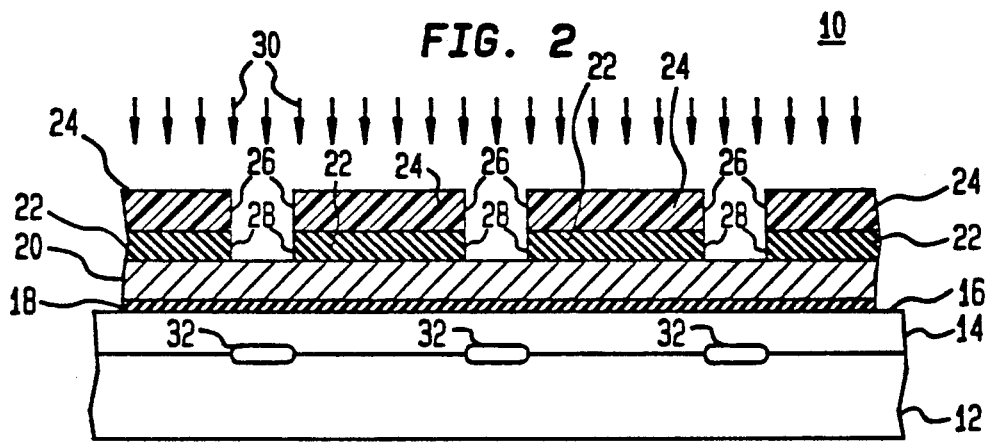

Referring now to FIG. 2, there is shown a sectional view of the CCD 10 in a next stage of fabrication in accordance with the method of the present invention. The photoresist second masking layer 24 is defined, using standard photolithographic techniques, to form openings 26 therethrough. The openings 26 are spaced periodically along the channel region 14. The portions of the silicon dioxide first masking layer 22 at the bottom of the openings 26 are then removed using a suitable etchant for silicon dioxide. This provides openings 28 in the first masking layer 22 which are periodically spaced along the channel region 14 to divide the first masking layer 22 into a plurality of sections. As indicated by the arrows 30 a dopant of the opposite conductivity type as the channel region 14, i.e., p-type conductivity, are now implanted through the openings 26 and 28 into the channel region 14. This forms p-type conductivity barrier regions 32 in the channel region 14 which are spaced periodically along the channel region 14. Alternatively, storage regions may be implanted by using an implant of the same conductivity type as the channel region 14.

Figure 3:
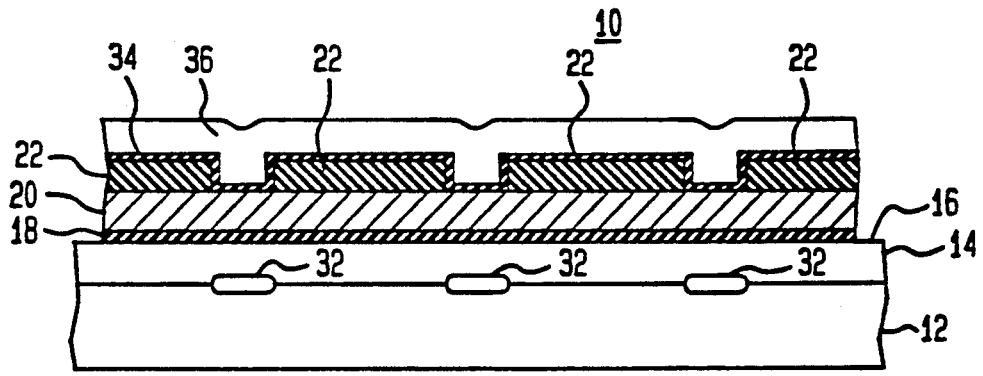

Referring now to FIG. 3, there is shown a sectional view of the CCD 10 in a next stage of fabrication in accordance with the method of the present invention. The photoresist second masking layer 24 is removed. A thin third masking layer 34 of conformal silicon nitride is deposited over the sections of the silicon oxide first masking layer 22 and the surface of the conductive layer 20 exposed by the openings 28 in the first masking layer 22. A thicker fourth masking layer 36 of conformal silicon dioxide is then deposited over the third masking layer 34 and fills the openings 28 in the first masking layer 22.

Figure 4:
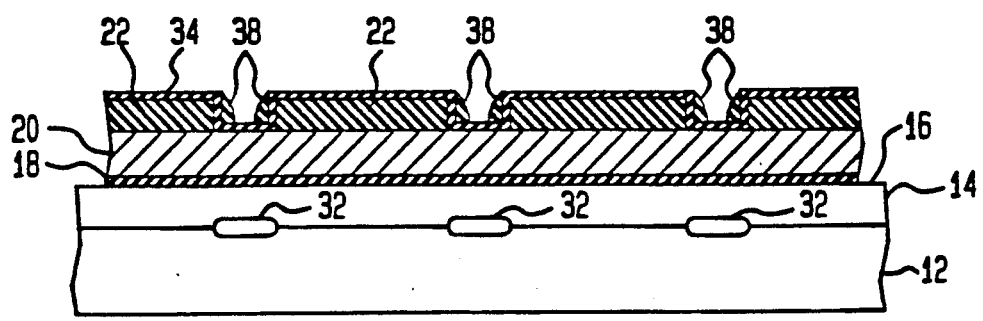

Referring now to FIG. 4, there is shown a sectional view of the CCD 10 in a next stage of fabrication in accordance with the method of the present invention. The fourth masking layer 36 is now etched with an anisotropic etch, such as a plasma etch. The anisotropic etch etches vertically to remove the silicon oxide fourth masking layer 36 down to the silicon nitride third masking layer 34. However, the vertical etching leaves spacers 38 of the fourth masking layer 36 extending along the portions of the third masking layer 34 which extend along the ends of the first masking layer 22 at the openings 28. However, the portions of the third masking layer 34 which extend over the first masking layer 22 and the surface of the conductive layer 20 between the spacers 38 are exposed.

Figure 5:
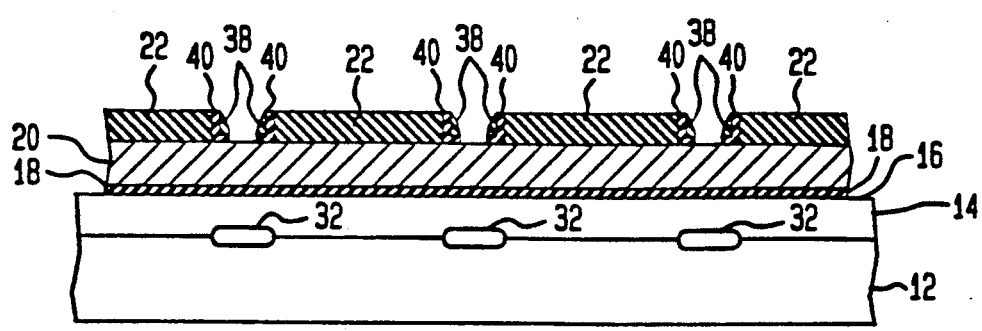

Referring now to FIG. 5, there is shown a sectional view of the CCD 10 in a next step of fabrication in accordance with the method of the present invention. The exposed portions of the silicon nitride third masking layer 34 are now removed with a suitable etchant. This leaves L-shaped pieces 40 of the silicon nitride third masking layer 34 under the spacers 38. The L-shaped pieces 40 extend along the ends of the sections of the first masking layer 22 at the openings 28 and along a short portion of the surface of the conductive layer 20 in the openings 28.

Figure 6:
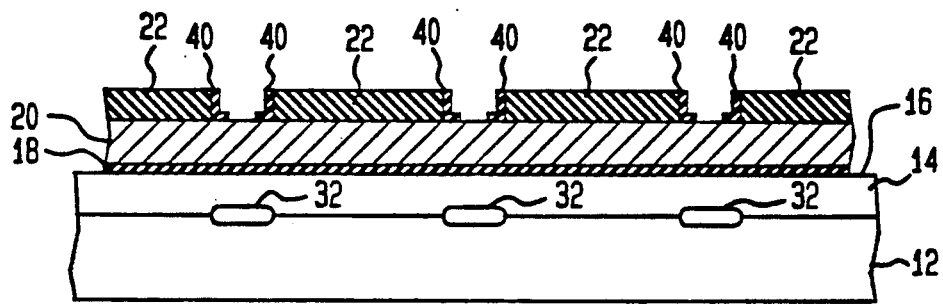

Referring now to FIG. 6, there is shown a sectional view of the CCD 10 in a next stage of fabrication in accordance with the method of the present invention. The silicon dioxide spacers 38 are removed with a suitable etchant, such as a wet chemical etching. This leaves the L-shaped pieces 40 exposed. Part or all of the first masking layer 22 is also removed in this process. The length of the bottom portions of the L-shaped pieces 40 is short, on the order of 0.1 to 0.2 microns. This length determines the width of the gap between the gate electrodes to be formed.

Figure 7:
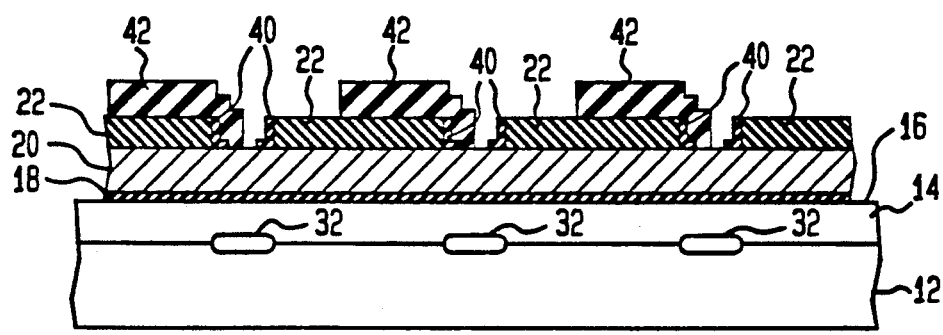

Referring now to FIG. 7, there is shown a sectional view of the CCD 10 in a next stage of fabrication in accordance with the method of the present invention. A fifth masking layer 42 of silicon oxide is formed over a portion of each section of any of the remaining first masking layer 22 and the L-shaped pieces 40 at only one end of each of each of the sections. The L-shaped pieces 40 which are covered by the fifth masking layer 42 are all at the same end of their respective section of the remaining first masking layer 22. The fifth masking layer 42 is formed by deposited by a low temperature deposition technique a layer of silicon dioxide over all of the sections of the remaining first masking layer 22, all of the L-shaped pieces 40 and the surface of the conductive layer 20 between the L-shaped pieces 40. The layer is then defined using standard photolithographic techniques and etching to form the fifth masking layer 42.

Figure 8:
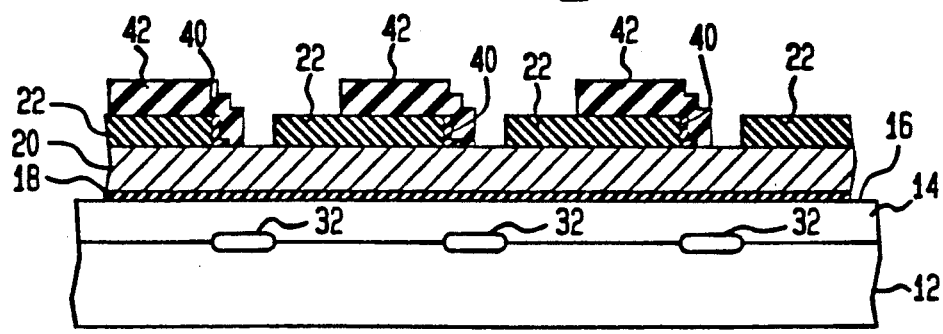

Referring now to FIG. 8, there is shown a sectional view of the CCD 10 in a next stage of fabrication in accordance with the method of the present invention. The exposed L-shaped pieces 40 are now removed using a suitable wet etchant for silicon nitride. This leaves the L-shaped pieces 40 which are under the fifth masking layer 42.

Figure 9:
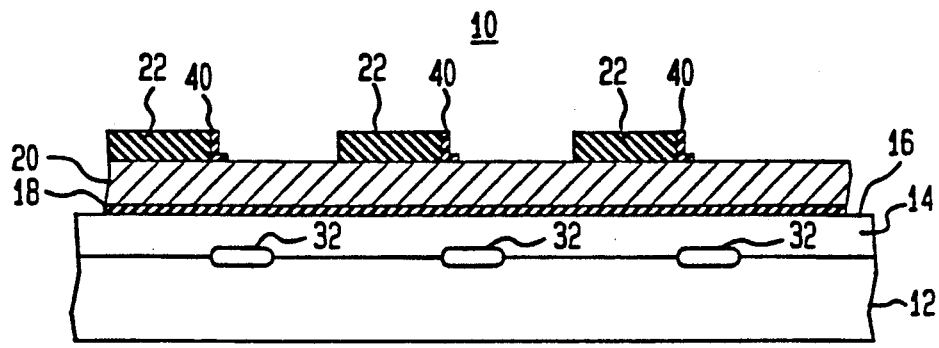

Referring now to FIG. 9, there is shown a sectional view of the CCD 10 in a next stage of fabrication in accordance with the method of the present invention. The fifth masking layer 42 is now removed with a suitable wet etching for silicon dioxide. Since the first masking layer 22 is also of silicon dioxide, this will also remove the portions of the section of the first masking layer 22 which were not covered by the fifth masking layer 42. If desired, another implant of p-type conductivity dopants may be made into the portions of the channel region 14 not covered by the first masking layer 22 to form a staircase barrier region (not shown), or an n-type implant for staircase storage regions. Alternatively, all of the silicon dioxide may be etched off, including the regions 22, leaving on the silicon nitride L-shaped pieces 40.

Figure 10:
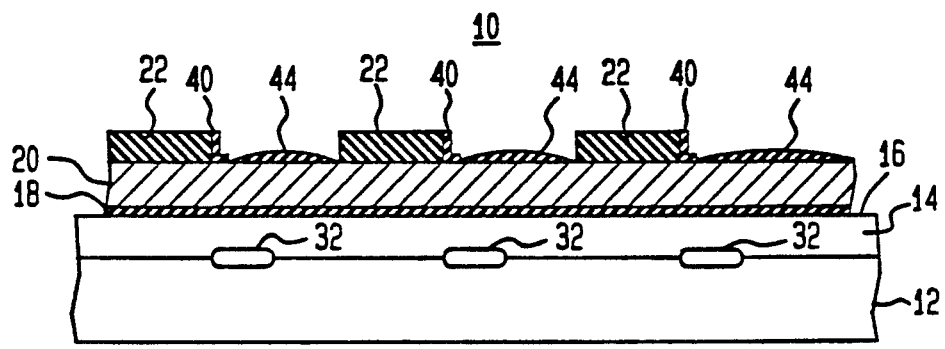

Referring now to FIG. 10, there is shown a sectional view of the CCD 10 in the next stage of fabrication in accordance with the method of the present invention. A sixth masking layer 44 of silicon dioxide is now formed on the portions of the conductive layer 20 not covered by the first masking layer 22 and the L-shaped portions 40. Since the conductive layer 20 is of polycrystalline or amorphous silicon, the sixth masking layer 44 is formed by heating the device in an atmosphere of oxygen to covert the surface of the exposed portions of the conductive layer 20 to silicon dioxide.

Figure 11:
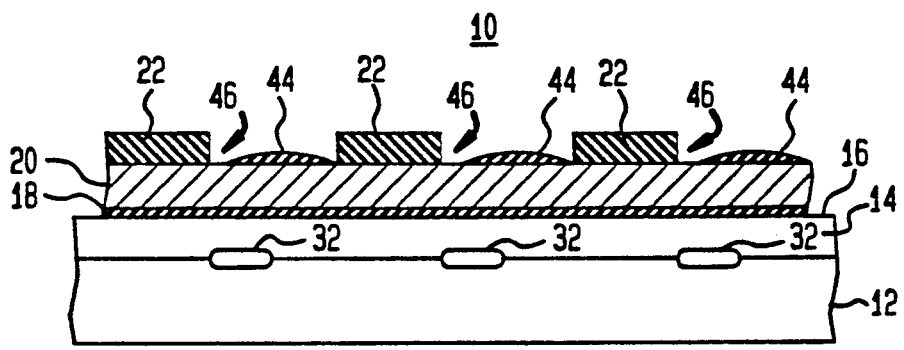

Referring now to FIG. 11, there is shown a sectional view of the CCD 10 in the next stage of fabrication in accordance with the method of the present invention. The L-shaped pieces 40 are removed using a suitable wet etchant for silicon nitride. This leaves a narrow gap 46 between each of the sixth masking layers 44 and an adjacent first masking layer 22. This gap 46 is used to define a gap between adjacent gate electrodes to be formed.

Figure 12:
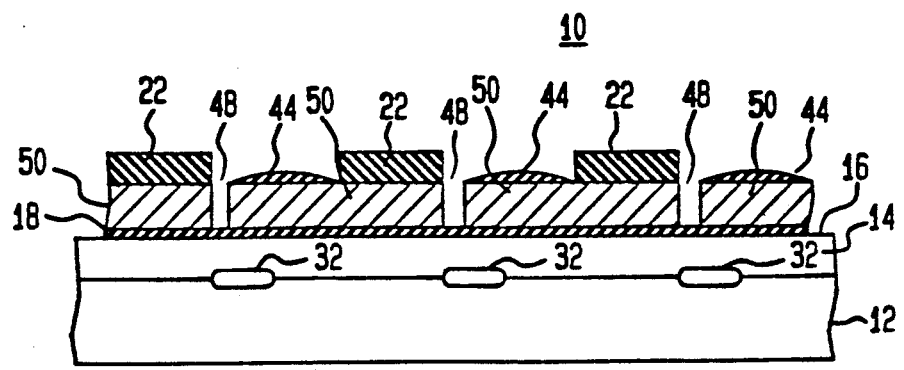

Referring now to FIG. 12, there is shown a sectional view of the CCD 10 in the next stage of fabrication in accordance with the method of the present invention. Using an anisotropic etch, such as a plasma etch, the portions of the conductive layer 20 exposed by the gaps 46 are etched down to the insulating layer 18. This forms grooves 48 through the conductive layer 20 which separates the conductive layer 20 into individual gate electrodes 50. The individual gate electrodes 50 are spaced apart by the grooves 48 which are submicron gaps. The gate electrodes 50 are positioned so that each has an edge thereof which is over a barrier region 32. The first and sixth masking layers 22 and 44 respectively, may now be removed with a suitable etchant, and the CCD 10 completed in the usual manner. To form a two-phase CCD 10, alternate gate electrodes 50 are connected to a first source of potential, and the other alternate gate electrodes 50 are connected to a second source of potential.

Thus, there is provided by the present invention a method of forming a two-phase CCD 10 in which all of the gate electrodes 40 are formed from a single layer (level) of a conductive material so as to provide a planar structure. The gate electrodes 50 are spaced apart by a narrow gap which is of relatively uniform width. The gap is defined by the L-shaped pieces 40, the bottom of which can be easily made of submicron length. This permits the gaps between the gate electrodes to be of submicron width.

It is to be appreciated and understood that the specific embodiments of the invention are merely illustrative of the general principles of the invention. Various modifications may be made consistent with the principles set forth. For example, the conductive layer which forms the gate electrodes may be made of various materials, such as doped polycrystalline silicon, an optically transparent conductor, such as tin oxide, a metal, metal alloy or a metal silicide. If an optically transparent conductor, such as tin oxide, a metal, metal alloy or metal silicide is used, a layer of polycrystalline or amorphous silicon must be provided thereover to permit the forming of the sixth masking layer 44 of grown silicon dioxide.

What is claimed is:

1. A method of making a planar CCD comprising the steps of:
    forming a layer of a conductive material on and insulated from a surface of a body of a semiconductor material of one conductivity type;
    forming sections of a first masking layer directly on the conductive layer with the sections being spaced apart along the conductive layer;
    forming a second masking layer at one end of each of the first masking layer sections with the second masking layers all being at the same end of their respective first masking layer section, each of the second masking layers having a portion extending across the space between its respective first making layer section and the adjacent first masking layer section;
    forming a third masking layer on the surface of the conductive layer in the space between the second masking layer and the adjacent first masking layer section;
    removing the second masking layer to expose a portion of the conductive layer between each first masking layer section and the adjacent third masking layer; and
    removing the exposed portions of the conductive layer to divide the conductive layer into gate electrodes having gaps therebetween.

2. The method of claim 1 in which the conductive layer has at least a surface portion comprising polycrystalline or amorphous silicon.

3. The method of claim 2 in which the second masking layers are of a material different from the materials of the first and third masking layers so that it can be etched by an etchant which does not readily attack the materials of the fist and third masking layers.

4. The method of claim 3 in which the second masking layers are L-shaped and are formed by the steps of:
    depositing a conformal layer of the material of the second masking layer over the first masking layer sections and the surface of the conductive layer in the spaces between the first masking layer sections;
    forming spacers of a material different from that of the second masking layer along the portions of the second masking layer which extend along the ends of the first masking layer sections and along the conductive layer away from the ends of the first masking layer sections;
    removing the portions of the second masking layer not covered by the spacers to form the L-shaped second masking layer at each end of the first masking layer sections; and
    removing the L-shaped second masking layer at one end of each of the first masking layer sections leaving the L-shaped second masking layer only at the other end of each of the first masking layer sections.

5. The method of claim 4 further comprising the steps of:
    forming a layer of the same material as the first masking layer sections over a portion of each of the first masking layer sections and the L-shaped second masking layer at only the other end of the first masking layer sections; and then
    removing the L-shaped masking layer at the one end of each first masking layer section which is not covered so as to leave the L-shaped second masking layer at only the other end of the first masking layer sections.

6. The method of claim 5 in which the spacers are formed by applying a conformal layer of the material of the spacers over the layer of the material of the second masking layer and filling the spaces between the first masking layer sections; and anisotropically etching the layer of the material of the spacers down to the layer of the material of the second masking layer leaving the spacers at the ends of the first masking layer sections.

7. The method of claim 6 in which the first masking layer sections and the spacers are of silicon dioxide, and the second masking layer is of silicon nitride.

8. The method of claim 7 in which the third masking layers are of silicon dioxide and are formed by heating the amorphous or polycrystalline silicon portion of the conductive layer in an atmosphere containing oxygen.

9. The method of claim 1 in which prior to forming the conductive material layer on the body, a channel region of a conductivity type opposite to that of the body is formed in the body and extending to the surface of the body.

10. The method of claim 9 in which after the first masking layer sections are formed, a dopant is embedded into spaced portions along the channel region through the spaces between the first masking layer sections to form barrier or storage regions in the channel region.

11. A method of making a planar, two-phase CCD comprising the steps of:

forming in a body of a semiconductor material of one conductivity type a channel region of the opposite conductivity type which extends to a surface of the body;

forming a layer of an insulating material on the surface of the body and over the channel region;

forming a layer of a conductive material on the insulating material layer;

forming sections of a first masking layer on the conductive layer with the sections being spaced apart along the channel region;

embedding a dopant into the channel region at spaced portions therealong through the spaces between the first making layer sections to form barrier or storage regions in the channel region;

forming an L-shaped second masking layer at one end of each of the first masking layer sections with the L-shaped second masking layers all being at the same end of their respective first masking layer sections, each of the L-shaped second masking layers having a portion extending along the end of its respective first masking layer section and another portion extending across the space between its respective first masking layer section and the adjacent first masking layer section;

forming a third masking layer on the surface of the conductive layer in the spaces between the L-shaped second masking layer and the adjacent first making layer section;

removing the L-shaped second masking layers to expose a portion of the conductive layer between each first masking layer section and the adjacent third masking layer; and etching through the exposed portions of the conductive layer to divide the conductive layer into gate electrodes having gaps therebetween.

12. The method of claim 11 in which the conductive layer has at least a surface portion comprising polycrystalline or amorphous silicon.

13. The method of claim 12 in which the conductive layer is entirely of polycrystalline silicon.

14. The method of claim 12 in which the conductive layer is an optically transparent conductor, a metal, metal alloy or metal silicide coated with a layer of deposited silicon.

15. The method of claim 12 in which each L-shaped second masking layer extends along the conductive layer a distance less than one micrometer from its respective first masking layer section.

16. The method of claim 15 in which the L-shaped second masking layers are of a material different from the materials of the first and third masking layers so that it can be etched by an etchant which does not readily attack the materials of the first and third masking layers.

17. The method of claim 16 in which the L-shaped second masking layers are formed by the steps of:

depositing a conformal layer of the material of the second masking layer over the first making layer sections and the surface of the conductive layer in the spaces between the first masking layer sections;

forming spacers of a material different from that of the second masking layer along the portions of the second masking layer which extend along the ends of the first masking layer sections and along the conductive layer away from the ends of the first masking layer sections;

removing the portions of the portions of the second masking layer not covered by the spacers to form an L-shaped second masking layer at each end of each first masking layer section; and then removing the L-shaped second masking layer at one end of each of the first masking layer sections.

18. The method of claim 17 further comprising the steps of:

forming a layer of the same material as the first masking layer sections over a portion of each of the first masking layer sections and the L-shaped second masking layer at the other end of each of the first masking layer sections; and then removing the L-shaped second masking layer at the one end of each of the first masking layer sections which is not covered to leave an L-shaped second masking layer at only the other end of each of the first masking layer sections.

19. The method of claim 18 in which the spacers are formed by applying a conformal layer of the material of the spacers over the layer of the material which forms the second masking layers and filling the spaces between the first masking layer sections; and anisotropically etching the layer of the spacers down to the layer of the material of the second masking layer leaving the spacers at the ends of the first masking layer sections.

20. The method of claim 19 in which the third masking layers are of silicon dioxide and are formed by heating the deposited silicon portion of the conductive layer in an atmosphere containing oxygen.

* * * * *